(12) United States Patent
Chin et al.

(10) Patent No.: US 8,501,565 B2
(45) Date of Patent: Aug. 6, 2013

(54) METHOD FOR FABRICATING DEEP TRENCH ISOLATION

(75) Inventors: Yu-Lung Chin, Tainan (TW); Shang-Hui Tu, Tainan (TW); Shin-Cheng Lin, Tainan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 253 days.

(21) Appl. No.: 13/181,689

(22) Filed: Jul. 13, 2011

(65) Prior Publication Data
US 2012/0190169 A1   Jul. 26, 2012

(30) Foreign Application Priority Data
Jan. 26, 2011  (TW) .............................. 100102797 A

(51) Int. Cl.
*H01L 21/336* (2006.01)
(52) U.S. Cl.
USPC ........................................................ 438/270

(58) Field of Classification Search
None
See application file for complete search history.

(56) References Cited

U.S. PATENT DOCUMENTS
5,013,680 A * 5/1991 Lowrey et al. ................ 438/242
2006/0131689 A1 * 6/2006 Tsukidate ..................... 257/506

* cited by examiner

*Primary Examiner* — Charles Garber
*Assistant Examiner* — Andre' C Stevenson
(74) *Attorney, Agent, or Firm* — Birch, Stewart, Kolasch & Birch, LLP

(57) ABSTRACT

The invention provides a method for fabricating a deep trench isolation including: providing a substrate; forming a first trench in the substrate; conformally forming a first liner layer on the sidewall and bottom of the first trench; forming a first filler layer on the first liner layer and filling the first trench; forming an epitaxial layer on the substrate and the first trench; forming a second trench through the epitaxial layer and over the first trench; conformally forming a second liner layer on the sidewall and bottom of the second trench; and forming a second filler layer on the second liner layer and filling the second trench.

16 Claims, 5 Drawing Sheets

METHOD FOR FABRICATING DEEP TRENCH ISOLATION

CROSS REFERENCE TO RELATED APPLICATIONS

This Application claims priority of Taiwan Patent Application No. 100102797, filed on Jan. 26, 2011, the entirety of which is incorporated by reference herein.

BACKGROUND OF THE INVENTION

1. Field of the Invention

The present invention relates to an isolation structure, and in particular relates to a deep trench isolation structure.

2. Description of the Related Art

With the increase in integration of devices within an integrated circuit, containing electronic interference between two adjacent devices has become more of a challenge. Namely, electronic interference between two adjacent devices increases as the distance therebetween decreases. Thus, an appropriate isolation structure is needed to prevent interference between two adjacent devices within an integrated circuit.

In general, especially for high-voltage devices, a deep trench isolation structure is needed in order to isolate the high-voltage devices in low concentration deep wells or a low concentration epitaxial layer.

FIG. 1A-1C show a conventional method for fabricating a deep trench. Referring to FIG. 1A, a substrate 102 is provided, and an epitaxial layer 104, a hard coat layer 106 and a photoresist layer 108 are sequentially formed on the substrate 102. Then, a patterned photoresist layer with an opening is obtained by a lithography process. Then, referring to FIG. 1B, a deep trench 110 is formed by etching the hard coat layer 106, epitaxial layer 104 and the substrate 102 along the opening. Next, referring to FIG. 1C, the patterned photoresist layer 108 and the hard coat layer 106 are removed, and a TEOS oxide layer 112 is formed to line the sidewall and bottom of the deep trench 110. A polysilicon layer 114 is formed on the TEOS oxide layer 112 and filled in the deep trench 110. Then, a conventional deep trench isolation structure is obtained by removing residual TEOS oxide layer 112 and the polysilicon layer 114 on the epitaxial layer 104 by an etching-back process.

The depth of the deep trench 110 is about 3.5 μm and deeper than that of shallow trench isolation (STI), and thus a deep trench with a high aspect ratio and good depth profile is difficult to obtain. Additionally, it is difficult to fill the TEOS oxide layer and polysilicon layer into the deep trench, such that undesirable voids may be formed in the deep trench, which would deteriorate the reliability of the deep trench.

Accordingly, there is a need to develop a method for fabricating a deep trench to solve the above-mentioned problems.

BRIEF SUMMARY OF THE INVENTION

The invention provides a method for fabricating a deep trench isolation comprising: providing a substrate; forming a first trench in the substrate; conformally forming a first liner layer on the sidewall and bottom of the first trench; forming a first filler layer on the first liner layer and filling the first trench; forming an epitaxial layer on the substrate and the first trench; forming a second trench through the epitaxial layer and over the first trench; conformally forming a second liner layer on the sidewall and bottom of the second trench; and forming a second filler layer on the second liner layer and filling the second trench.

A detailed description is given in the following embodiments with reference to the accompanying drawings.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 2A-2E show cross-sectional schematic representations of various stages of fabricating a deep trench isolation in accordance with an embodiment of the invention. Note that other active devices and passive devices which are well known to those skilled in the art may be included in the steps illustrated in FIG. 2A-2E.

Figure 1A:
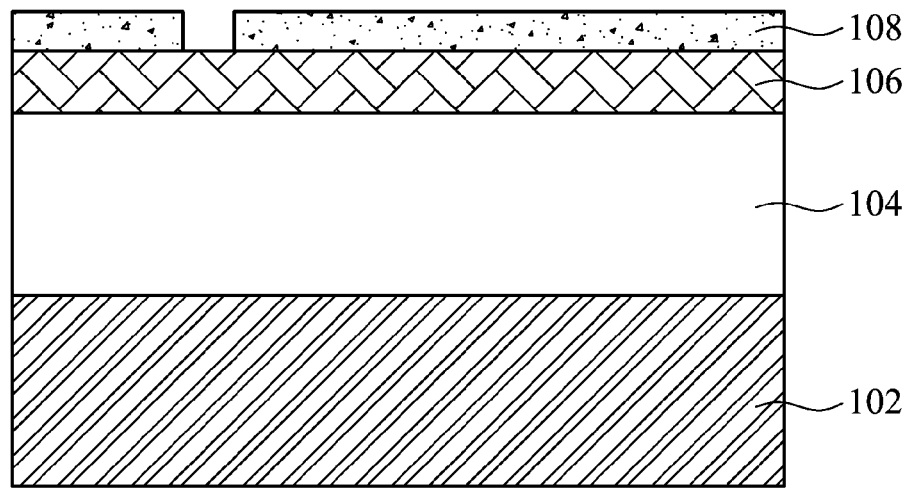
FIGS. 1A-1C show cross-sectional schematic representations of various stages of fabricating a conventional deep trench isolation.
Figure 1B:
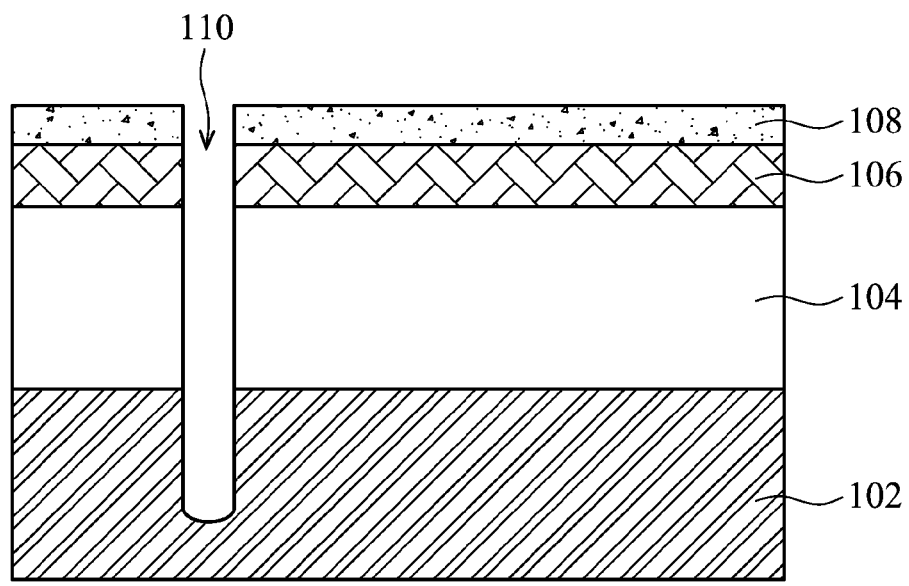
Figure 1C:
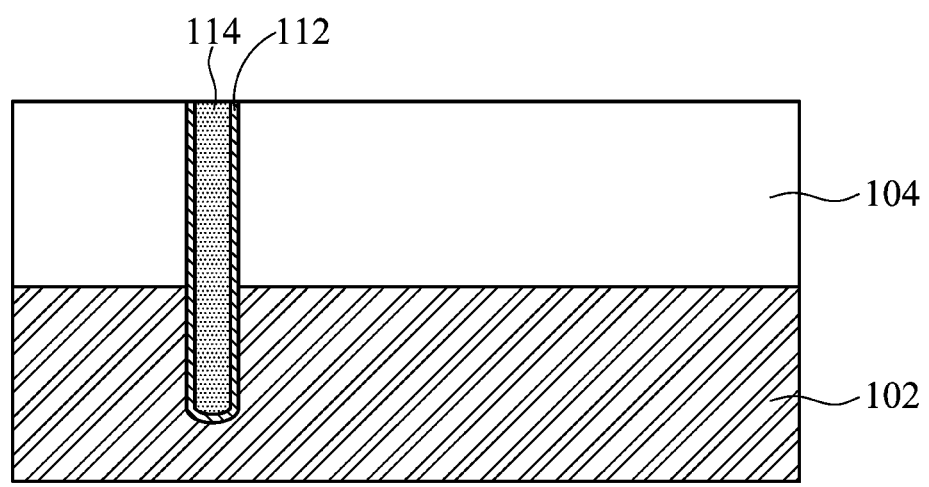
Figure 2A:
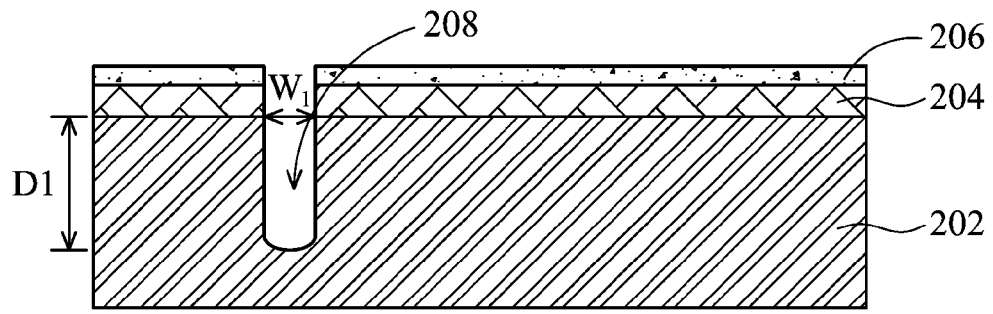
FIGS. 2A-2E show cross-sectional schematic representations of various stages of fabricating a deep trench isolation in accordance with an embodiment of the invention.

Referring to FIG. 2A, a substrate 202 is firstly provided. In one embodiment, the substrate 202 is a p-type substrate which is formed by doping of a p-type dopant into a Si substrate, wherein the p-type dopant comprises boron, gallium, aluminum, indium or combinations thereof. Then, a first hard coat layer 204 and a first photoresist layer are sequentially formed on the substrate 202, and the first hard coat layer 204 comprises silicon nitride or silicon oxynitride. The first hard coat layer 204 is fabricated by a chemical vapor deposition method, such as an atompheric pressure chemical vapor deposition (APCVD), low-pressure chemical vapor deposition (LPCVD) or plasma enhanced chemical vapor deposition (PECVD) method. Then, a first patterned photoresist layer 206 with a pattern of a deep trench is formed by performing a patterning process (such as exposure, development and etching methods, etc.) to the first photoresist layer.

Then, a first trench 208 is formed in the substrate 202 by an etching step and by using the first patterned photoresist layer 206 as a mask. The first trench 208 has a depth of D1 and a width of W1, wherein D1 is about 0.5-50 μm, and preferably about 3-30 μm, W1 is about 0.1-10 μm, and preferably 1-5 μm, and the aspect ratio (depth D1/width W1) is about 1-250. The etching step is a step such as a plasma etching step, the gas used in the etching chamber is a gas such as fluorocarbon gas, carbon oxide gas, argon gas or oxygen gas, and the fluorocarbon gas is a gas such as $CF_3$, $C_2F_6$, $C_2F_4$ or $C_3F_6$.

Figure 2B:
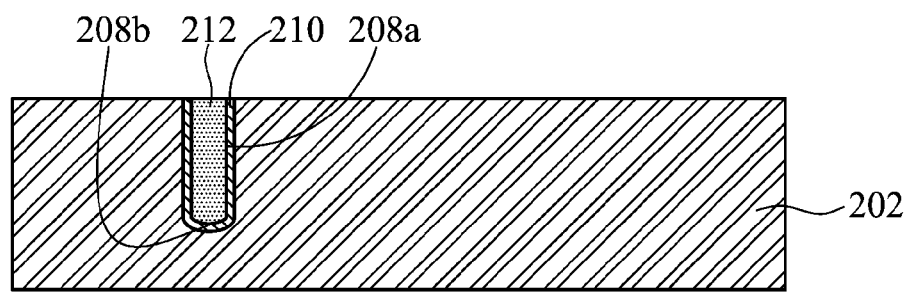

Referring to FIG. 2B, the first hard coat layer 204 and the first patterned photoresist layer 206 are removed and a first liner layer 210 is conformally formed on the substrate 202, sidewall 208a and bottom 208b of the first trench 208. The first liner layer 210 is used as an isolation layer and comprises tetraethoxysilane oxide (TEOS-oxide), silicon oxide ($SiO_2$), silicon oxynitride (SiON), silicon nitride ($Si_3N_4$) or combinations thereof. Note that the materials of the first liner layer 210 are not limited to the above-mentioned materials. Thus, other isolation materials are also included in the scope of the invention. The first liner layer 210 has a thickness of about 0.001-1 μm. In one preferable embodiment, the first liner layer 210 is tetraethoxysilane oxide (TEOS-oxide). The first liner layer 210 is formed by a chemical vapor deposition method, such as an atompheric pressure chemical vapor deposition (APCVD), low-pressure chemical vapor deposition (LPCVD) or plasma enhanced chemical vapor deposition (PECVD) method.

Next, a first filler layer 212 is formed on the first liner layer 210 and fills the first trench 208. The first filler layer 212 may increase the stress in the first trench 208 to prevent defects in the first trench 208 and comprises tetraethoxysilane oxide (TEOS-oxide) or oxynitride. The method for fabricating the first filler layer 202 may comprise an atompheric pressure chemical vapor deposition (APCVD), low-pressure chemical vapor deposition (LPCVD) or plasma enhanced chemical vapor deposition (PECVD) method.

Then, the first liner layer 210 and the first filler layer 212 outside of the first trench 208 are removed to expose the first liner layer 210 and the first filler layer 212. The method for removing the first liner layer 210 and the first filler layer 212 may comprise an etch back or chemical mechanical polishing (CMP) method.

Figure 2C:
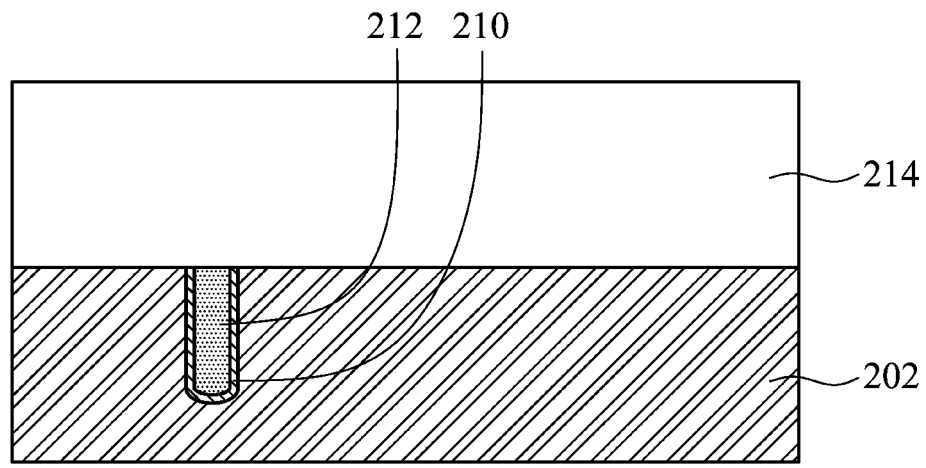

Referring to FIG. 2C, an epitaxial layer 214 is formed on the substrate 202 and the first trench 208. In one embodiment, the epitaxial layer 214 has an n-type conductivity while the substrate 202 has a p-type conductivity. The n-type conductivity is obtained by doping with an n-type dopant, such as phosphorus, arsenic, nitrogen, antimony or combinations thereof. An amorphous silicon material is deposited on the substrate 202 and the first trench 208 by a chemical vapor deposition method, and then the epitaxial layer 214 is obtained by a solid phase epitaxy method. In another embodiment, the epitaxial layer 214 has a p-type conductivity while the substrate 202 has an n-type conductivity.

Figure 2D:
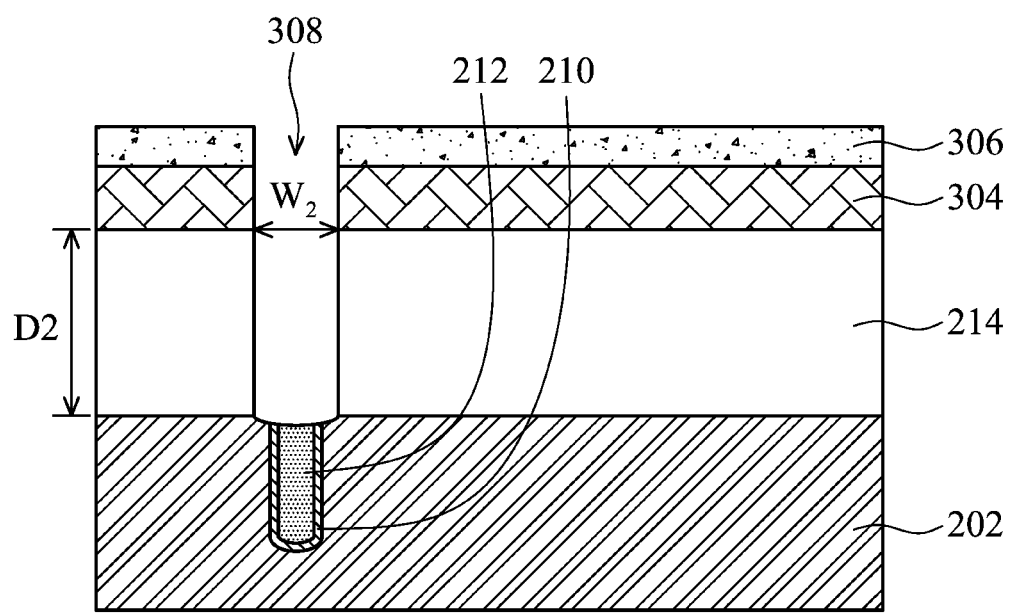

Referring to FIG. 2D, a second hard coat layer 304 and a second photoresist layer are sequentially formed on the epitaxial layer 214. The second hard coat layer 214 comprises silicon nitride or silicon oxynitride. Then, a second patterned photoresist layer 306 with a pattern of a second deep trench is formed by performing a patterning process (such as exposure, development and etching methods, etc.) to the first photoresist layer. Next, a second trench 308 is formed by etching the second hard coat layer 304 and the epitaxial layer 214, wherein the etching is stopped at the first trench 208 to expose the first trench 208. The second trench 308 is formed by an etching step and by using the second patterned photoresist layer 306 as a mask. The second trench 308 has a depth of D2 and a width of W2, wherein D2 is about 0.5-50 μm, and preferably about 3-30 μm, W2 is about 0.1-10 μm, and preferably 1-5 μm, and the aspect ratio (depth D2/width W2) is about 1-250. The etching step for the second trench 308 is the same as that for the first trench 208, and thus detailed descriptions are omitted herein for brevity.

Note that a sum of the depths of the first trench 208 and the second trench 308 is about 1-100 μm to form the deep trench isolation of the invention, and the total aspect ratio (total depth (D1+D2)/total width (W1+W2)) is about 2-500. The deep trench isolation of the invention is obtained by two etching steps which are performed before and after formation of the epitaxial layer 214, and thus compared with the prior art (formed by an etching step), a deeper depth and good depth profile of the deep trench isolation of the invention is obtained.

Additionally, the width W2 of the second trench 308 is preferably larger than or equal to the width W1 of the first trench 208. The epitaxial growth of the epitaxial layer 214 on the first filler layer 212 is difficulty due to the poor crystal quality of the first filler layer 212. Thus, the portions of epitaxial layer 214 directly above the first filler layer 212 have a poor quality epitaxial, and thus are preferably removed by the second etching step to form the second trench 308. The second trench 308 preferably has a width W2 that is larger than the width W1 of the first trench 208 such that most of the poor quality epitaxial portions of the epitaxial layer 214 are removed. In one embodiment, the width W2 of the second trench 308 is larger than the width W1 of the first trench 208, wherein the difference is preferably of about 0-5 μm.

Figure 2E:
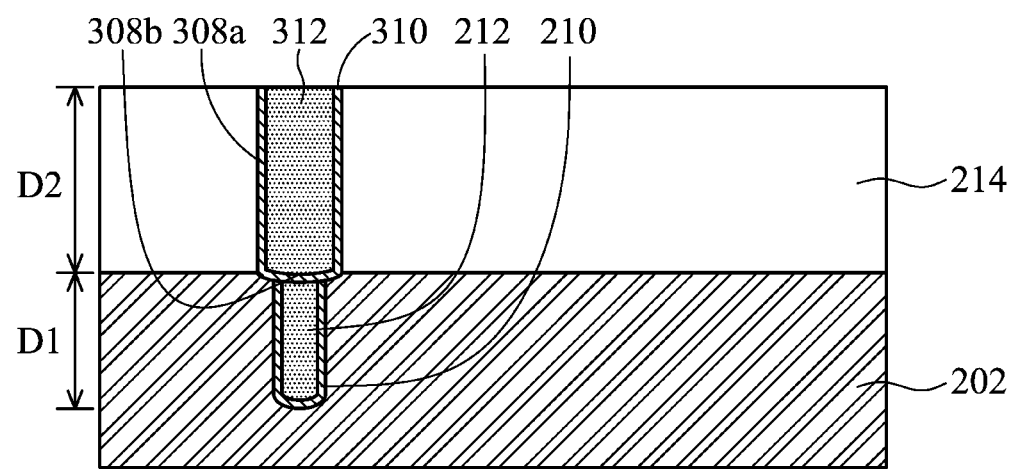

Referring to FIG. 2E, the second hard coat layer 304 and the second patterned photoresist layer 306 are removed and a second liner layer 310 is conformally formed on the sidewall 308a and bottom 308b of the second trench 308. The material and fabrication method of the second liner layer 310 is the same as that of the first liner layer 210. In one embodiment, the first liner layer 210 and the second liner layer 310 are preferably made of tetraethoxysilane oxide (TEOS-oxide). The second liner layer 310 has a thickness of about 0.001-2 μm.

Next, a second filler layer 312 is formed on the second liner layer 310 and fills the second trench 208. The second filler layer 312 comprises tetraethoxysilane oxide (TEOS-oxide) or oxynitride. In the prior art, it is difficulty to fill a deep trench with a high aspect ratio, such that some voids may be formed in the deep trench due to incomplete filling of the filler layer. The reliability of the deep trench is deteriorated due to the presence of the voids. Note that, compared with the prior art, filling in of the deep trench isolation of the invention is made simpler by two filling steps, and thus results in a significant throughput increase.

Then, the second liner layer 310 and the second filler layer 312 above the epitaxial layer 214 are removed to expose the second liner layer 310 and the second filler layer 312. The method for removing the first liner layer 210 and the first filler layer 212 comprises an etch back or chemical mechanical polishing (CMP) method.

From the above description, the method for fabricating the deep trench isolation of the invention has the following advantages:

(1) The deep trench isolation of the invention is obtained by two etching steps which are performed before and after forming of the epitaxial layer 214, and thus compared with the prior art (formed by an etching step), a deeper depth and good depth profile of the deep trench isolation of the invention is obtained.

(2) Compared with the prior art, filling in of the deep trench isolation of the invention is made simpler by two filling steps, and thus results in a significant throughput increase.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a deep trench isolation, comprising:
   providing a substrate;
   forming a first trench in the substrate;

conformally forming a first liner layer on the sidewall and bottom of the first trench;

forming a first filler layer on the first liner layer and filling the first trench;

forming an epitaxial layer on the substrate and the first trench;

forming a second trench through the epitaxial layer and over the first trench;

conformally forming a second liner layer on the sidewall and bottom of the second trench; and forming a second filler layer on the second liner layer and filling the second trench.

2. The method for fabricating the deep trench isolation as claimed in claim 1, wherein the method for fabricating the first trench comprises:

forming a first hard coat layer on the substrate;

forming a first patterned photoresist layer on the first hard coat layer; and forming the first trench in the substrate by an etching step and using the first patterned photoresist layer as a mask.

3. The method for fabricating the deep trench isolation as claimed in claim 1, after forming the first filler layer, further comprising:

removing the first liner layer and the first filler layer outside of the first trench.

4. The method for fabricating the deep trench isolation as claimed in claim 2, wherein the first hard coat layer comprises silicon nitride or silicon oxynitride.

5. The method for fabricating the deep trench isolation as claimed in claim 1, wherein the method for fabricating the second trench comprises:

forming a second hard coat layer on the epitaxial layer;

forming a second patterned photoresist layer on the second hard coat layer; and forming the second trench in the epitaxial layer by an etching step and using the second patterned photoresist layer as a mask.

6. The method for fabricating the deep trench isolation as claimed in claim 1, after forming the second filler layer, further comprising:

removing the second liner layer and the second filler layer outside of the second trench.

7. The method for fabricating the deep trench isolation as claimed in claim 5, wherein the second hard coat layer comprises silicon nitride or silicon oxynitride.

8. The method for fabricating the deep trench isolation as claimed in claim 1, wherein a sum of the depths of the first trench and the second trench is about 1 µm-100 µm.

9. The method for fabricating the deep trench isolation as claimed in claim 1, wherein the width of the second trench is larger than that of the first trench.

10. The method for fabricating the deep trench isolation as claimed in claim 1, the width of the second trench is equal to that of the first trench.

11. The method for fabricating the deep trench isolation as claimed in claim 1, wherein the substrate has a p-type conductivity, and the epitaxial layer has an n-type conductivity.

12. The method for fabricating the deep trench isolation as claimed in claim 1, wherein the substrate has an n-type conductivity, and the epitaxial layer has a p-type conductivity.

13. The method for fabricating the deep trench isolation as claimed in claim 1, wherein the first liner layer has a thickness of about 0.001-1 µm.

14. The method for fabricating the deep trench isolation as claimed in claim 1, wherein the second liner layer has a thickness of about 0.001-2 µm.

15. The method for fabricating the deep trench isolation as claimed in claim 1, wherein the first liner layer and the second liner layer independently comprise tertaethoxysilane oxide (TEOS), silicon oxide ($SiO_2$), silicon oxynitride (SiON) or silicon nitride ($Si_3N_4$).

16. The method for fabricating the deep trench isolation as claimed in claim 1, wherein the first filler layer and the second filler layer comprise polysilicon.

\* \* \* \* \*